United States Patent [19]
Chen et al.

[11] Patent Number: 5,873,161
[45] Date of Patent: Feb. 23, 1999

[54] METHOD OF MAKING A Z AXIS INTERCONNECT CIRCUIT

[75] Inventors: Yu Chen; Joel Arthur Gerber; Joshua Woodward Smith, all of St. Paul, Minn.

[73] Assignee: Minnesota Mining and Manufacturing Company, St. Paul, Minn.

[21] Appl. No.: 685,125

[22] Filed: Jul. 23, 1996

[51] Int. Cl.$^6$ ........................................ H05K 3/36
[52] U.S. Cl. ................... 29/830; 29/840; 29/843
[58] Field of Search ............. 29/840, 830, 843; 174/264, 263; 361/795, 778

[56] References Cited

U.S. PATENT DOCUMENTS

| | | | |
|---|---|---|---|
| 3,646,670 | 3/1972 | Maeda et al. | 29/627 |
| 3,832,769 | 9/1974 | Olyphant, Jr. et al. | 29/626 |
| 3,835,531 | 9/1974 | Luttmer | 29/625 |
| 4,648,179 | 3/1987 | Bhattacharyya et al. | 29/832 |
| 5,046,238 | 9/1991 | Daigle et al. | 29/830 |
| 5,282,312 | 2/1994 | DiStefano et al. | 29/830 |
| 5,309,629 | 5/1994 | Traskos et al. | 29/830 |
| 5,401,913 | 3/1995 | Gerber et al. | 174/264 |
| 5,440,075 | 8/1995 | Kawakita et al. | 174/265 |
| 5,502,884 | 4/1996 | Ladouceur | 29/407.05 |

FOREIGN PATENT DOCUMENTS

| | | |
|---|---|---|
| 1307594 | 9/1992 | Canada . |
| 0 346 525 A2 | 12/1989 | European Pat. Off. . |
| 0 530 840 A1 | 3/1993 | European Pat. Off. ......... H05K 3/32 |
| 530840A1 | 3/1993 | European Pat. Off. . |
| 0 607 532 A2 | 7/1994 | European Pat. Off. . |
| 0 607 534 A2 | 7/1994 | European Pat. Off. ......... H05K 3/46 |
| 0 647 090 A1 | 4/1995 | European Pat. Off. ......... H05K 3/40 |
| 2 724 052 | 3/1996 | France ..................... H01L 21/60 |
| 01042193 | 2/1989 | Japan ........................ H05K 1/11 |

*Primary Examiner*—Carl E. Hall
*Attorney, Agent, or Firm*—H. Sanders Gwin, Jr.

[57] ABSTRACT

Method for making Z-axis interconnections between adjacent circuit layers with electrically conductive traces, in multi-layered circuits, include connecting a conducting member of a deformable material to a circuit board layer and depositing an adhesive layer over an adjacent circuit board layer. The adjacent circuit layers are aligned, with the conducting member substantially collinear with the conductive traces of the adjacent circuit layers, and the circuit layers are brought together by pressure, such that the conducting member penetrates the adhesive layer and deforms until it "cracks". The cracking exposes fresh (unoxidized) material that contacts a conductive trace, joining the circuit layers together and creating a low resistance electrical connection. The adhesive serves to bound expansion of the deformable conducting member, reducing any potential contacts with adjacent conducting members.

15 Claims, 6 Drawing Sheets

METHOD OF MAKING A Z AXIS INTERCONNECT CIRCUIT

FIELD OF THE INVENTION

The present invention relates to multiple joined circuit layers for use in electronic packages. In particular, the invention relates to improved Z-axis electrical interconnections between adjacent circuit layers and to methods for making these interconnections between these circuit layers.

BACKGROUND OF THE INVENTION

Multiple layered circuits of joined adjacent circuit layers are used to make complex electrical Circuits in electronics packages. Common names for these packages include printed circuit boards (PCBs), both single and double sided, multi-chip modules, single and multiple chip carriers, ball grid arrays, chip on board assemblies, etc. These circuit layers typically include a pattern of conductive traces which are used to interconnect electrical components. The conductive traces are commonly of a conductive metal, e.g., copper, bonded to, or otherwise incorporated into, an insulating substrate, which mechanically supports the conductive traces. Insulating, substrates typically include dielectric materials that can be rigid or flexible and fabricated of materials including, for example polymers, ceramics, glasses, silicon etc. The conductive traces may be formed using any number of techniques, for example electroplating, etching, sputtering, mechanical attachment using adhesives and others. Electrical connections between components of the electrical circuits are provided on the circuit layers of the multi-layer circuit. Using, multiple circuit layers allows the circuit designer to lay out complex circuit designs using single or multiple components, that require numerous interconnections. Multiple circuit layers increase component density and functionality per unit volume.

The conductive traces in each circuit layer of a multi-layer circuit act as wires and are Used to interconnect the various components of the circuit. Electrical connection between adjacent circuit layers is achieved using, "vias". A via is created by forming a hole between adjacent circuit layers. Conductive material is then deposited on the side walls of the hole to form an electrical connection between the two adjacent circuit layers.

Typically, in printed circuit board (PCB) fabrication, otherwise known as printed wiring board or plated through hole (PTH) technology, the conductive (electrical) traces are formed separately on each layer of the multi-layer circuit board. The circuit board layers of the multi-layer circuit board are then stacked and aligned to each other with an electrically insulating bonding layer between the adjacent layers. The assembled layers are then subjected to heat and pressure to provide a bond between the adjacent layers. Via holes are then drilled in the appropriate locations where interconnect pads are desired on successive layers. The electrical interconnect is achieved by applying a conductive material to the side walls of the via holes. The prior art requires the metal via contact pads to have sufficient area on the circuit board to accommodate the drill cross section and/or any misalignment. These large pad areas limit the component density of the circuit board.

These vias are "stacked" when they extend through all of the circuit board layers from top to bottom. However, since these vias are drilled through the entire board, the vias and their target pads consume significant portions of the circuit area, limiting routing in boards with many layers. Long via columns are a reliability concern due to thermal expansion mismatch between the dielectric and the via metal. Furthermore, it is desirable to have vias much smaller in diameter than what is economically feasible to drill. To form blind and buried vias, i.e., those which pass into the top layer only or connect only adjacent layers not passing through the entire board thickness, the two or more layers are laminated first to form a sub-assembly and then drilled and plated forming connections through the dielectric. Several of these sub-assemblies are then laminated together again and a second drilling and plating operation is carried out to provide connections between the sub assemblies. To fabricate more complex multi-layered board assemblies, several of these multi-layered assemblies may be laminated, drilled and plated in a third cycle. The addition of these multiple lamination, drilling and plating steps adds significant processing costs as well as yield loss due to damage to internal vias during subsequent lamination steps and the failure of long through hole vias due to thermal expansion.

The advent of semiconductor processing and advanced materials has permitted the fabrication of circuit boards on a much finer scale than the printed circuit boards described above. Examples of these include ceramic hybrids and thin film deposited substrates, such as multi-chip modules (MCMs).

Typically, these circuits are manufactured in small numbers for aerospace, military and supercomputer applications. An example would be MCM-Ds. The D refers to deposition where a circuit is built up upon an inorganic non-conducting substrate using, thin film approaches with copper or aluminum traces and organic or inorganic dielectric. Using these technologies, a multi layer circuit is built up by a sequential process. This technology is capable of fabricating very fine lines and vias (blind, stacked, and buried) resulting, in increased circuit densities, when compared to the conventional plated through hole technology described above.

However, this increased density is at the cost of much more expensive processing, that is usually accomplished in sequential batch processing that typically includes using complex, expensive equipment. Batch processing does not lend itself to high volume production and the sequential fabrication results in lower yield as the deposition of one defective layer ruins an entire part.

To overcome some of the disadvantages of the above approaches, a number of alternative approaches to circuit interconnect (circuit assembly) construction have been developed.

Canadian Patent No. 1,307,594 and U.S. Pat. No. 5,502,884 disclose a multi-layer electronic circuit formed of electronic circuit layers metallized on both sides. The metal is then patterned with the desired circuit structures required for each layer using conventional techniques. The two electronic circuit layers are connected together by interposing an adhesive connecting layer of an insulating resin containing electrically conductive particles.

U.S. Pat. No. 5,282,312 (DiStefano et al.) discloses a two metal seeded flexible circuit patterned with plated through holes (vias). The connection between the circuit layers is made by a bond-ply with patterned conductive adhesive buttons. The buttons on the bond ply are placed on the same grid spacing as the PTHs on the flexible circuit and the bond-ply contains an impenetrable dielectric core that prevents shorting through the bond-ply. During lamination (also known as lay-up), the circuit and interposer bond-ply layers are registered to one another and the entire system is joined together. However, a drawback to this system is that the patterned interposed bond-ply layer adds cost to the system, due to the fabrication. Moreover, the exacting registration of the interposed layer to the circuit layers decreases the resultant Circuit density and yield.

U.S. Pat. No. 3,832,769 (Olaphant, Jr. et al.) discloses a method of forming a connection between adjacent layers of a printed circuit. Metal conductive columns extend from vias above the plane of the dielectric film, that contains the vias. Conductive land areas or contact pads are then bonded to the extending portions of the conductive columns. However, the joints made by the contact between the metal conductive columns and the contact pads are not sufficient to mechanically hold the circuit layers together. This is especially a problem when the dielectric material is thin and flexible and the vias of the connecting circuit layers are small in size (height and diameter) and few in number. In addition, the via connections are left exposed to the environment where they can corrode easily.

U.S. Pat. No. 5,401,913 (Gerber et al.) discloses using columns (bumps) of a rigid metal for interconnecting multiple circuit board layers in a multilayer circuit. The circuit board layers are formed by depositing a trace metal layer onto one side of a dielectric layer and making a via on the other side. The via holes are formed in the dielectric film, where a connection to an adjacent circuit board layer is desired. These via holes are then filled with a rigid non-reflowable conductive metal, as bumps that protrude from the surface of the dielectric layer. The rigid conductive bumps are then coated with an electrically conducting metal which is capable of forming a metal to metal bond between the bump and the adjacent pad to which it is expected to connect and bond thereto.

There is further disclosed deposition of an electrically insulating adhesive bonding material over the Surfaces of the circuit board layers. A plurality of these layers are then stacked, aligned and laminated together under heat and pressure in a single lamination step. The metal surfaces of the bumps and pads are bonded together, resulting in both electrical and mechanical connections.

However, the use of a rigid non reflowable conductive metal for the bumps makes rework of the bumps difficult. In addition, the rigid nature of the bumps limits the tolerable height variation of the bumps since taller bumps form pedestals preventing adjacent shorter bumps from forming good contacts. This limits the utility of the invention especially when blind and buried vias are desired.

U.S. Pat. No. 5,046,238 (Daigle et al.) discloses a fusible dielectric material that is provided with circuitry on one side and vias exposing the circuitry on the other side. A fusible conductive material is deposited in the vias. Stacking a plurality of these structures together in registration to one another, they may be laminated together under heat and pressure, fusing the conductive via material with other conductive via material and/or corresponding circuit pads and fusing the dielectric material to the rest of the circuit. A drawback to this method is that very few fusible dielectric materials are dimensionally stable enough to make a high density circuit board in this manner. Additionally, these materials are extremely expensive. As a result, forming a circuit on these fusible dielectrics requires the conductive material to be fused at high temperatures. In addition, the dielectric material must necessarily fuse at a temperature well above temperatures the substrate will see in subsequent assembly operations in order to maintain dimensional stability and remain bonded. The high fusion temperatures are commonly above the melting temperatures of more conventional low cost fusible conductors that might be used in the via, causing the via metallurgy to melt during lamination. Molten metal in the laminate is difficult to control when it melts simultaneously with the softening of a fusible dielectric, as it may be pushed out of the via area, resulting in unwanted connections between conductors that should remain isolated. Simultaneously, the conductive metal is depleted from the via where the connection is desired, thus the connection may be formed improperly, or not at all. Finally, fusion at high temperatures tends to contaminate some metallurgies on surface conductors causing problems in later assembly processes.

SUMMARY OF THE INVENTION

The present invention improves on the prior art by providing methods for making Z-axis electrical connections in multi-layered circuits, and multi-layered circuit made by these methods. Specifically, the circuit layer interconnections of the present invention are made with deformable electrically conducting materials, in the form of bumps, that create electrical connections between adjacent circuit layers, thus providing, electrical conduction, along the Z-axis. (The Z-axis being perpendicular to the plane of the circuit layers.) The deformability of the bumps also allows for bump height non-uniformity in creating reliable electrical connections.

The methods of the present invention include providing at least first and second circuit layers with respective conductors, typically circuit traces or the like. At least one conducting member, typically of a metal, deformable upon the application of pressure, in the form of a bump, is then placed onto at least the first circuit layer in electrical contact with the conductor. An adhesive layer is then placed intermediate the first circuit layer, on the side having the conducting member and the second circuit layer, on the side having the conductor, and the first and second circuit layers are aligned. The fist and second layers are then pressed together to join them, such that the pressure deforms the conducting member, to expose fresh material from below its surface, that is minimally if at all oxidized. This fresh material is such that it places the conducting member in electrical communication with the conductor on the second circuit layer, resulting in a low resistance electrical connection The invention also teaches a multi-layer circuit interconnect that can be formed without exacting bump heights, for the bumps are formed of a deformable material that yields upon the application of pressure when the circuit layers forming the device are joined. The multi-layer circuit interconnect includes at least first and second circuit layers, each of the circuit layers including conductors. At least one conducting member, such as a bump of a deformable material, with a height approximately equal to the distance between the conductors of the first and second circuit layers in the circuit layer interconnect, is intermediate the conductors of the first and second circuit layers and is in electrical communication with both conductors. An adhesive layer is also intermediate the first and second circuit layers, with at least portions of the adhesive layer in contact with the bump to inhibit bump expansion when the bump is deformed under pressure when forming the multi-layer circuit interconnect.

BRIEF DESCRIPTION OF THE DRAWINGS

The present invention will be described with reference to the accompanying drawings, wherein like reference numerals identify corresponding or like components.

In the Drawings.

DETAILED DESCRIPTION OF THE DRAWINGS

Figure 1A:
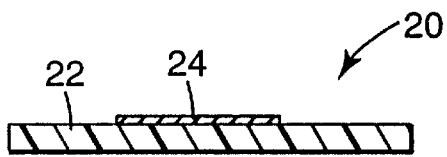
FIGS. 1a–1g are cross sectional views of a first method of the present invention.
Figure 1B:
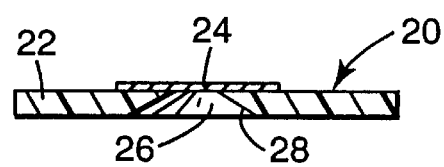

Turning now to the drawing figures, and in particular drawing FIGS. 1a–1g, 3a–3h and 4a–4e, respectively, there are detailed three methods for electrically interconnecting two or more circuit layers. As used throughout this application "circuit layers" refers generally to dielectrics or other equivalent materials that support conductive members, such as circuit traces, pads or other electrically conducting, pathways. Thee dielectrics employed may be either rigid or flexible (non-rigid)

Figure 1C:
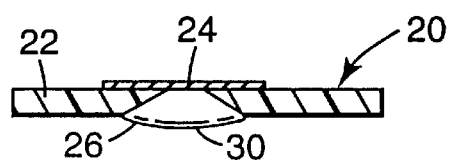
Figure 1D:
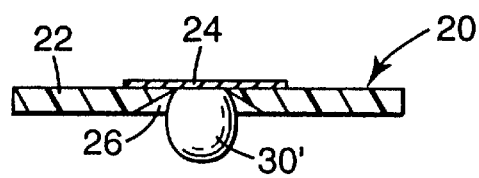

Additionally, in accordance with the present invention, only a single electrical interconnection between two circuit layers is shown in FIGS. 1a–1g, 3a–3h, and 4a–4e. It should be noted that this single interconnect (between two circuit layers) is exemplary only, for purposes of illustrating the methods of the present invention. The present invention typically involves multiple circuit layers, a portion thereof is shown in FIGS. 2a and 2b, and described accordingly. Each circuit layer of these multiple circuit layers may include multiple vias. The vias, as discussed above, may be "stacked", "blind", or "buried" vias, respectively, depending upon their orientation within these circuit layers. These vias accommodate multiple electrical interconnections.

In FIGS. 1a–1g, there is detailed a first method for preparing and interconnecting circuit layers 20, 21. These circuit layers 20 (FIG. 1a), 21 are typically formed of a dielectric layer 22, 23, of a material such as a polyimide film, and a pad 24, 25, circuit trace or other electrically conducting pathway, preferably of an electrical conducting material such as copper. The pads 24, 25 may be attached to electrically conducting traces on the circuit layer. A hole 26 is then made in the dielectric layer 22 of the first circuit layer 20 (FIG. 1b), preferably, by wet milling or dry milling techniques. Wet milling techniques may involve, for example, chemical etching and the like. Dry milling techniques include, for example, laser ablation, ion milling reactive ion etching and the like.

This hole 26 in the dielectric extends to the pad 24 and may be formed (by the above described techniques) into any shape (round, square, rectangular, triangular, ovular, etc.) desired. The via walls 28 extend from the pad 24.

A material that is malleable and thus deformable under the pressures disclosed below, and is of good electrical conductivity, is then deposited into the hole 26 in the form of a "bump" 30. These bump 30 materials include tin, aluminum, indium, lead, gold, silver, bismuth, and the like and alloys of these materials. The deposition is such that the bump 30 contacts the pad 24, allowing for electrical conduction (FIG. 1c). The bump 30 may be deposited such that it either extends above (beyond) the plane of the dielectric layer 22, or alternately is level with or below this plane. The metal used to form the bump 30 may be deposited into the vias 26 by electrodeposition, mechanical deposition of solder pastes or solder balls into the hole(s) 26, or other methods known in the art.

The bump 30 height may be increased in a single step or multiple steps. A preferred method of increasing bump height involves reflowing the bump material. Other bump heightening techniques include microreplication, mechanical working, wicking and the like. During the reflow, the temperature of the bump 30 is raised to a temperature above the melting point of the metal of the bump 30. Heating of the bump 30 may occur in a convection oven, infrared oven, a vapor phase reflow oven, or the like. A flux may be used to aid in the reflow.

This bump heightening step(s) is required, when the initially deposited bump 30 is even with or does not extend above (beyond) the plane of the dielectric layer 22, to heighten the bump to a point where it extends above (beyond) the plane of the dielectric layer 22. This bump heightening step(s) is/are optional, but preferred, when the initially deposited bump extends above (beyond) the plane of the dielectric material layer. The bump 30 is preferably reflowed into a rounded shape (FIG. 1d), although other shapes may be obtained for the reflowed bump 30 (provided that at least a portion of the bump 30 extends beyond the plane of the dielectric layer 22).

Bump height is important, for a higher ratio of bump height to bump width (known as the "aspect ratio") and a bump height above (beyond) the plane of the dielectric layer 22, allows for the bumps 30 to initially penetrate the adhesive of the adhesive layer 34 and subsequently collapse, by expanding outward, when the circuit layers 20, 21 are brought together by pressure (detailed below) (FIGS. 1f, 1g, 2a and 2b). The material of the bump 30 must be of sufficient rigidity to allow the bumps 30 to penetrate the adhesive of the adhesive layer 34 (discussed below). Moreover, a tall and narrow bump (of a high aspect ratio), upon compression, will have less outward expansion and thus take up less circuit area in the resultant circuit, such that this circuit it call be of an increased wiring density.

Should the deposition process yield less than 100% deposited bumps in the vias, or should the bumped material be damaged during handling such that a bump (or bumps) fall out of the via(s), a new bump may be placed mechanically or by other means into the empty via hole. A simple reflow process such as described above for bump heightening may be used to fuse the new bump into its via hole.

Figure 1E:
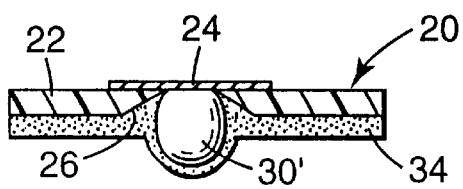
Figure 2A:
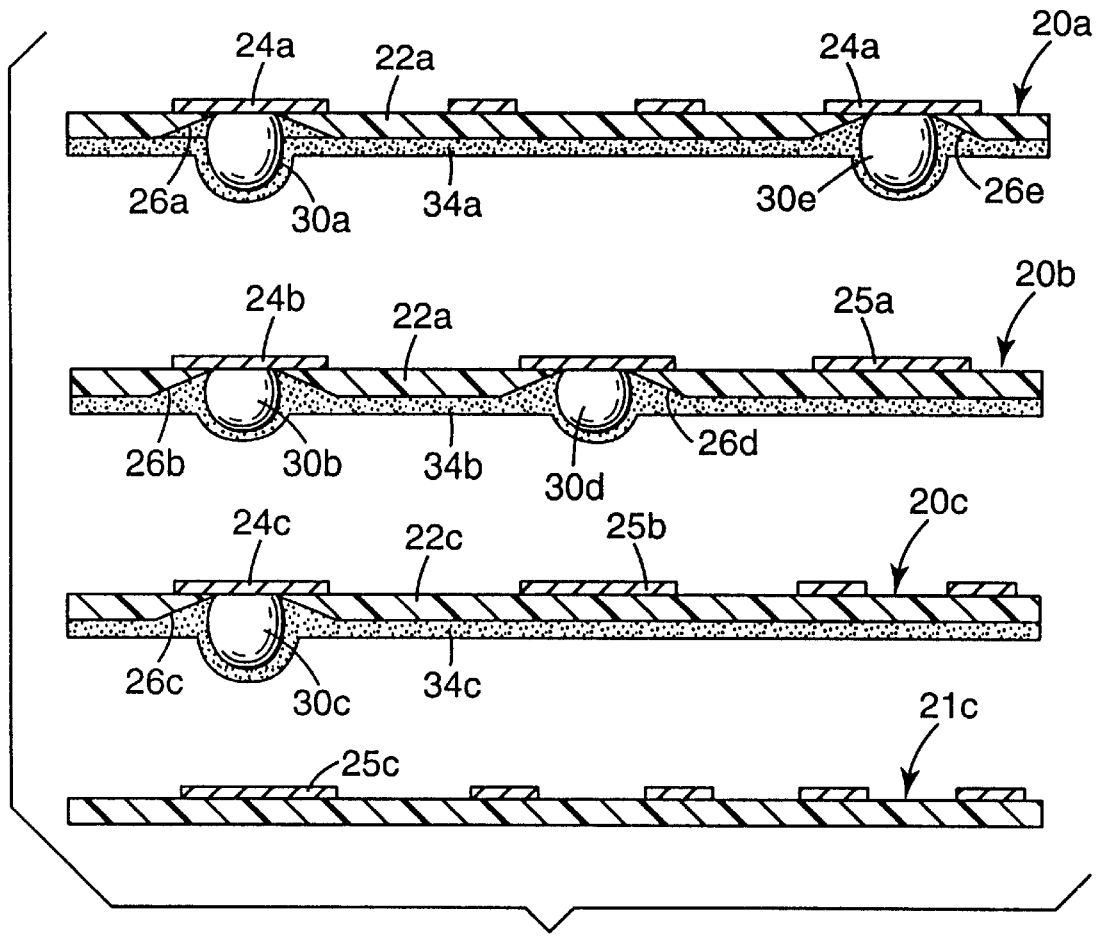
FIGS. 2a and 2b are cross sectional views of FIGS. 1f and 1g in a multi-layer, multi via circuit interconnect (circuit assembly)
Figure 2B:
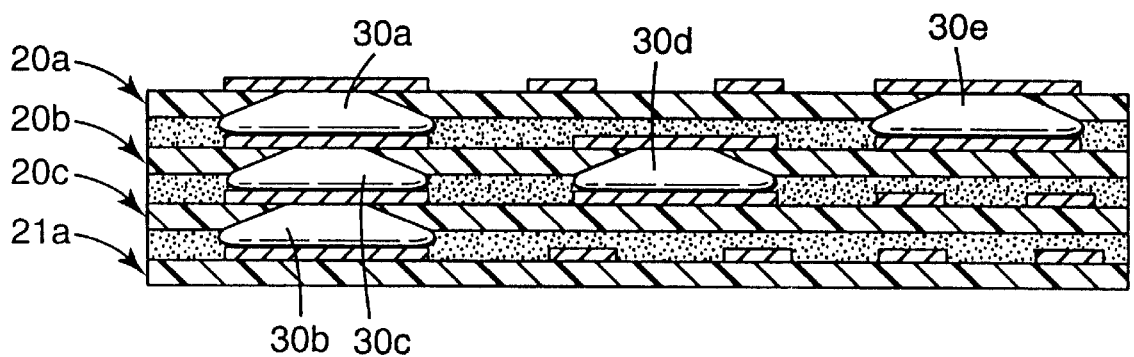

In FIG. 1e, an adhesive layer 34 is deposited on the first circuit layer 20. Adhesives suitable for tills application, include thermosetting or thermoplastic adhesives, either alone or in combinations thereof. Examples include epoxies, cyanate esters, acrylates, phenolics, silicones, polyimides, polyamide and the like. Alternately, the adhesive layer 34 could be deposited on the lower circuit layer 21, or placed between the circuit layers 20, 21 during lamination (detailed below). The adhesive is selected to have a lower softening point than that of the metal of the bump 30, and in the case of a thermosetting adhesive, the adhesive flows and/or cures at a temperature less than the melting temperature of the material of the bump 30, so as to flow and/or cure without melting the metal of the bump 30 or the pads 24, 25. The reasons for these softening parameters will become apparent as detailed below .

Figure 1F:
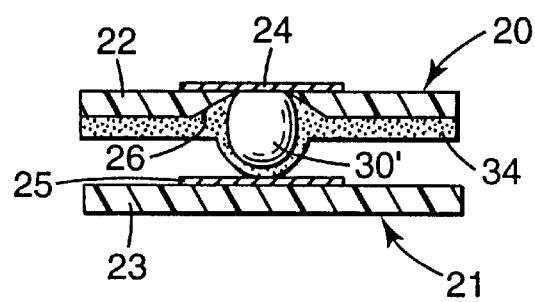

As shown in FIG. 1f, the circuit layers 20. 21 are now aligned and brought together, forming intermediate circuit 36. Specifically, the via with the metal bump 30 is aligned with its corresponding pad 25 on the lower adjacent circuit layer 21. The alignment can be performed by any suitable conventional alignment technique, Such as mechanical alignment using alignment pins, optical registration using fiducials and other methods known in the art.

Once alignment is complete, the lamination process for joining the circuit layers begins. Initially, there may be a heating, step (or steps) dependent upon the adhesive(s) used and/or if additional softening of the metal of the bump) is desired to enhance the deformability of the bump 30. The heating, step(s) is/are preferred with some adhesives to induce flow, and cure the adhesive. These heating steps are preferably performed at temperatures below the melting temperatures of the metal that forms the bump 30, in order to allow penetration of the bump through the adhesive of the adhesive layer 34 and to avoid excessive out-flow of metal (from melting), that can create short circuits in the resultant structure.

Figure 1G:
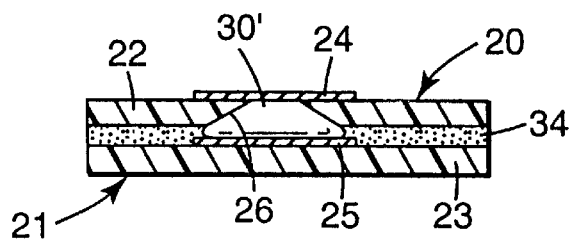

In FIG. 1g, the circuit layers 20, 21 are further brought together to form a circuit interconnect 39, by the application of pressure (simultaneously with, before, or after the heating step(s) if such a step(s) is employed). The compressive force, preferably a clamping force, is sufficient to deform the bump 30. Since the bump 30 is of greater rigidity with respect to the adhesive of the adhesive layer 34, the adhesive softens before the bump deforms. After the bump 30 has penetrated the adhesive layer 34, the continued pressure from the clamping, force serves to deform the bump 30 and displace the adhesive of the adhesive layer 34 outward. The material of the bump 30 makes a substantial physical contact with the pad 25.

Once this metal to metal (bump 30 to pad 25) physical contact is made continued pressure further deforms the bump 30 outward, causing the metal at the surface 30' of the bump 30, which is typically oxidized, to "crack". This "cracking" exposes fresh metal from the interior of the bump 30 that wipe and/or smears across the pad 25. This fresh metal, released from the interior of the bump, is minimally, if at all oxidized, and provides a strong metallic joint and a low resistance electrical connection between the pad 25 and the bump 30, as a result of the fresh unoxidized metal. The resultant intimate contact between the material of the bump 30 and pad metal 24, 25 facilitates solid state diffusion between the respective pads 24, 25 and the bump 30, across the contact interface, form a metallic joint.

The adhesive now cures and serves to mechanically join the circuit layers 20, 21 together. This curing also serves to encapsulate the material of the bump 30, by inhibiting its outward expansion. The flowing of this adhesive, coupled with the pressure on the bump 30, as it collapses, and the circuit layer 20, moves the adhesive to fill air spaces in the region of the via 26, eliminating voids for moisture accumulation, thereby improving corrosion resistance, At some point during or after the lamination process, the pressure is then released and the heat (if the lamination process involved heating) is terminated. The heat (if involved with the process and not previously terminated) may be terminated either simultaneously with, before, or after the pressure has been released.

Once the adhesive is of sufficient rigidity to confine the metal of the bump 30 within the via 26 and from further expanding therein, an optional anneal may be performed on the resultant circuit interconnect 39. The anneal involves heating the circuit interconnect 39 to a temperature greater than the melting temperature of the metal of the bump 30. This anneal further enhances the electrical connection between the metal of the bump 30 and the pads 24, 25. Specially, as the annealing temperature reaches the melting temperature of the metal of the bump 30, the metal of the bump 30 becomes liquid. The bump 30 changes shape slightly to reduce the stress imposed by the expanding adhesive. As the anneal temperature decreases to below the melting temperature of the bump 30, the bump 30 solidifies while the adhesive keeps shrinking, thus, exerting a compressive force on the bump 30. This compressive force enhances reliability of the connection during, thermal cycling.

The now joined (and annealed if there was an optional anneal) circuit interconnect 39 is then allowed to cool down. Once this "cool down" step is complete, the now joined circuit interconnect is ready for use in electronics applications.

The alignment and lamination processes, illustrated in FIGS. 1f and 1g above, are further detailed in FIGS. 2a and 2b for multiple circuit layers 20a, 20b, 20c, 21a with multiple vias 26a–26e. The bumps 30a–30e in these drawing figures (FIGS. 2a and 2b) are exaggerated in height and uniformity to illustrate an advantage of the present invention. However, it is preferred that the bumps be of a uniform height, with only slight (if any) variations in height.

The deformability of the bumps 30a–30e allows for variations in bump heights, in the, vias 26a–26e. The bumps 30a–30e are of different heights, with all bumps extending above (beyond) the planes of their respective dielectric layers 22a, 22b, 22c, as disclosed above. Upon alignment and lamination, the bumps 30a–30e deform, such that all bumps make physical contact and sufficient electrical contact with their respective pads 24a–24c and 25a–25c, as disclosed above. The deformable (malleable) nature of the metal forming, the bumps 30a–30e allows for slight height variations among the bumps 30a–30e, for as taller bumps 30a, 30c and 30e collapse, and make physical contact with their respective pads 24b, 24c and 25c (and ultimately electrical contact as discussed above), the shorter bumps 30b and 30d subsequently make physical contact and ultimately sufficient electrical contact with their respective pads 24c and 25b.

This is especially important with bumps 30d in "buried" vias 26d and bumps 30e in "blind" vias 26e, as reliable connections forming metallic joints between the bumps 30d, 30e and their respective pads 24b, 25b, and 24a, 25a, can now be accomplished. This is a result of the bumps 30a–30c of the "stacked" vias 26a–26c being deformable and upon the application of pressure to the circuit layers 20a, 20b, 20c and 21a (upon lamination, as detailed herein), subsequently deforming to a height low enough to permit deformation of the bumps 30d, 30e associated with these "buried" 26d and "blind" 26e vias.

Figure 3A:
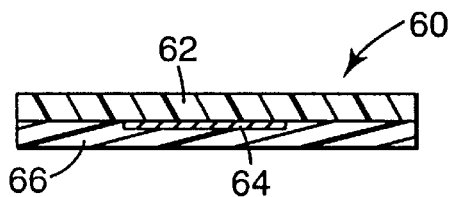
FIGS. 3a–3h are cross sectional views of a second method of the present invention.
Figure 3B:
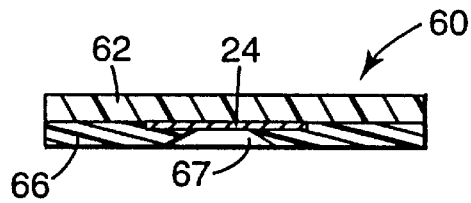
Figure 3C:
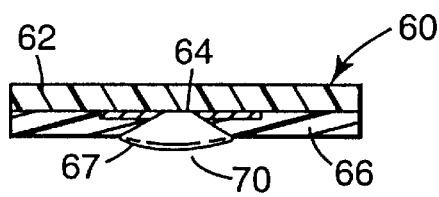
Figure 3D:
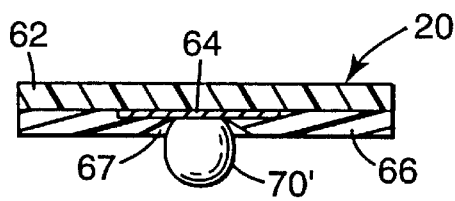
Figure 3E:
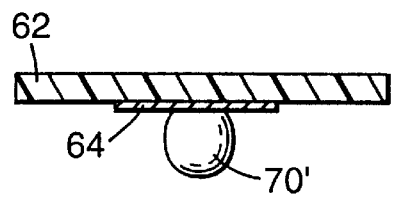
Figure 3F:
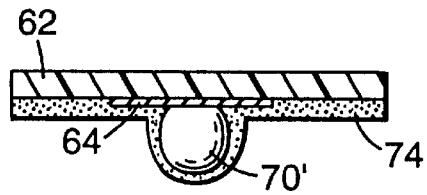
Figure 3G:
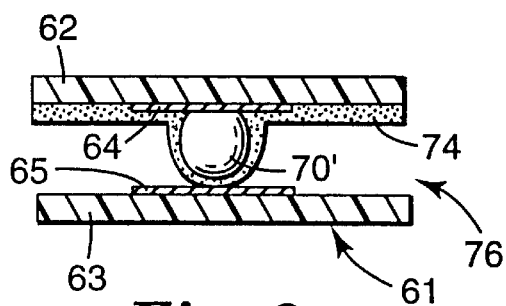
Figure 3H:
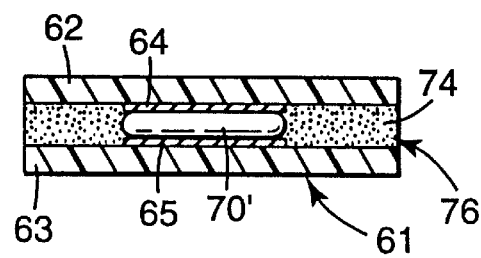

In FIGS. 3a–3h there is detailed a second method for interconnecting, circuit layers 60, 61 (FIGS. 3g and 3h). As shown in FIG. 3a, these circuit layers 60, 61 are typically formed of a dielectric material layer 62, 63 (FIGS. 3g and 3h), the materials disclosed above, and pads 64, 65 (FIGS. 3g, and 3h) of the conductor materials disclosed above. The first circuit layer 60 differs from that described above in that it further includes a masking layer 66, that may for example, be a photoresistive material having been placed onto the circuit layer 60 by conventional techniques. The photoresistive material is then exposed to radiation through a mask (not shown), and developed by processes such as chemical etching (with potassium hydroxide or the like), such that a hole 67 is formed in the photoresistive material layer 66, as shown in FIG. 3b. Alternately, the masking layer 66 may be deposited by coating and patterned by screen printings or the like.

Metal, as disclosed above, is then deposited into the hole 67 in the form of a "bump" 70, by the methods disclosed above, into contact with the pad 64, to allow for electrical conduction (FIG. 3c).

The masking material layer 66 is then removed by conventional processes with conventional strippers. The resultant circuit layer 60 is shown in FIG. 3e. Alternatively, the masking layer may be left on the circuit. In this case it is preferred that the bump 70 as deposited extend above (beyond) the plane of the masking layer 66. If this is not the case, a bump heightening step or steps (e.g., reflow), as disclosed above, may be used to bring the bump 70 above (beyond) the plane of the masking, layer 66, to increase the aspect ratio, as described above, and shown in FIG. 3d. Alternately, in an optional step, initially deposited bumps that extend above (beyond) the plane of the masking layer 66, may also be subjected to the above described bump step(s) to achieve a high aspect ratio. An adhesive layer 74, of the adhesive(s) disclosed above, is deposited on the first circuit layer 60, by the methods disclosed above (FIG. 3f). Alternatively, the adhesive layer 74 could be deposited on the lower circuit layer 61, or between the circuit layers 60, 61 during lamination as disclosed below (FIGS. 3g and 3h).

In FIG. 3g, the circuit layers 60, 61 are aligned and brought together, as described above, to form an intermediate circuit 76. Specifically, the metal bump 70 is aligned with its corresponding pad 65 on the lower adjacent circuit layer 61 (FIG. 3g), by any of the alignment methods disclosed above.

Once alignment is complete, lamination for joining the circuit layers 60, 61 begins. The lamination process is identical to that disclosed above, as the bump 70, typically having, an oxidized surface layer 70' (FIG. 3g) "cracks", exposing fresh metal from the interior of the bump 70, that wipes and/or smears across the pad 65. This fresh metal, as discussed above, provides a strong, metallic joint and a low resistance electrical connection between the pad 65 and the bump 70. The resultant circuit interconnect 79 is shown in FIG. 3h.

The post lamination annealing step, disclosed above, may be performed on the resultant interconnect structure 79, if desired, to strengthen the metallic bond and to reduce stresses in the via, as detailed above.

In FIGS. 4a–4e, there is detailed a third method for interconnecting circuit layers 80, 81 (FIGS. 4d and 4e), similar to that disclosed above and shown in FIGS. 3a–3h. The difference between these methods, is that this third method employs a bump deposited directly onto a pad and does not require the adding of a masking layer to define the location of the bump 90.

Figure 4A:
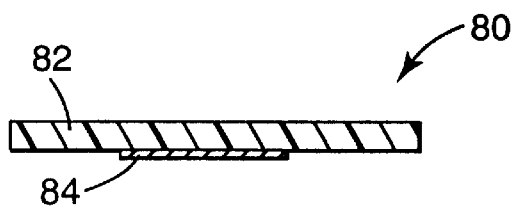
FIGS. 4a–4e are cross sectional views of a third method of the present invention.

As shown in FIG. 4a, these circuit layers 80, 81 (FIGS. 4d and 4e) are typically formed of a dielectric material layer 82, 83 (FIGS. 4d and 4e), the materials disclosed above, and pads 84, 85 (FIGS. 4d and 4e) of the conductor materials disclosed above.

Figure 4B:
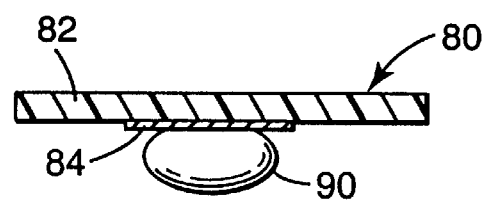
Figure 4C:
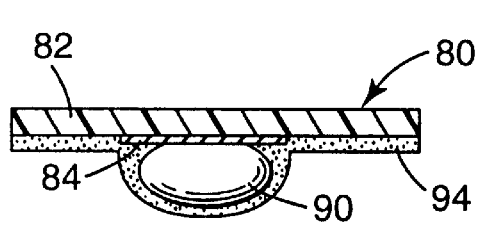

As shown in FIG. 4b, metal, as disclosed above, is then deposited onto the pad 84 in the form of a "bump" 90. An adhesive layer 94, of the adhesive(s) disclosed above, is deposited on the first circuit layer 80, by the methods disclosed above (FIG. 4c) Alternatively, the adhesive layer 94 could be deposited on the lower circuit layer 81 (FIGS. 4d and 4e), or between the circuit layers during lamination, detailed below (FIGS. 4d and 4e).

Figure 4D:
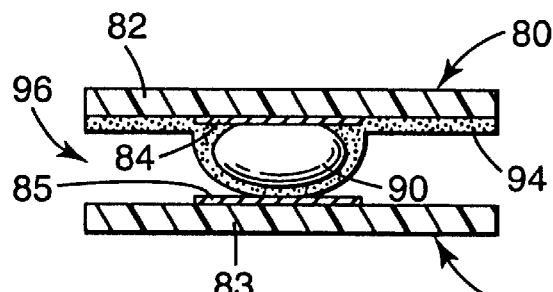
Figure 4E:
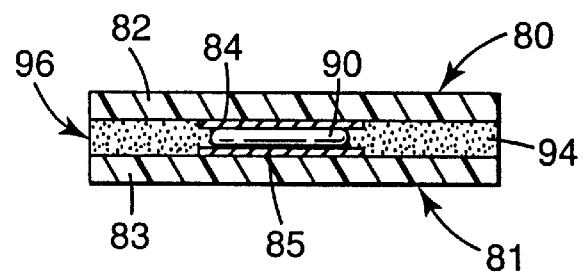

The circuit layers 80, 81 are then aligned and brought together, as described above, forming an intermediate circuit 96, as shown in FIG. 4d. Specifically, the bump 90 is aligned with its corresponding pad 85 on the lower adjacent circuit layer 81 , by any of the alignment methods disclosed above.

Once alignment is complete, lamination for joining the circuit layers 80, 81 begins. The lamination process is identical to that disclosed above, as the bump 90, typically having, an oxidized surface layer 90' (FIG. 4d) "cracks", exposing fresh metal from the interior of the bump 90, that wipes and/or smears across the pad 85. This fresh metal, as discussed above, provides a strong metallic joint and a low resistance electrical connection between the pad 85 and the bump 90. The resultant circuit interconnect 99 is shown in FIG. 4e.

The post lamination annealing step, disclosed above, may be performed on the result circuit interconnect 99, if desired, to strengthen the metallic bond and to reduce stresses at the via, as detailed above.

EXAMPLE 1

A polyimide dielectric film with patterned copper traces on one side and holes on the other side was obtained. The patterned traces and holes were made by conventional methods. The holes were located at points where electrical connections were desired. Pure tin was electrodeposited into the base of the holes using all electroplating solution (Solderon SC tin plating bath, from LeaRonel, Inc., Freeport, N.Y.), to form "bumps". A flux (Kester 2163 from Kester Corp.) was coated on the bump side of the dielectric film by brushing, and the entire circuit layer was placed into a convection oven at 255° C. for 15 seconds to reflow the tin bumps. The flux was then removed with water.

A layer of adhesive (Rflex 410, from Rogers Corporation, 100 N. Dobson Road Chandler, Ariz. 85224) was applied to the bump side by a hot roll laminator at 20 psi and 150° C. Four layers of the above disclosed dielectric films were stacked on top of each other using a metal plate mounted with pins for registration of the films, and the entire assembly was placed into a platen press. A small amount of pressure, approximately 5 psi, was applied and the press was heated at 15° C./minute to 205° C. and held there for 45 minutes. The press was then cooled to room temperature at 5° C./minute. A pressure of 850 psi was applied at 150° C. during the heat-up and held for the remainder of the cycle. The completed circuit interconnect (assembly) was removed from the press.

Figure 5:
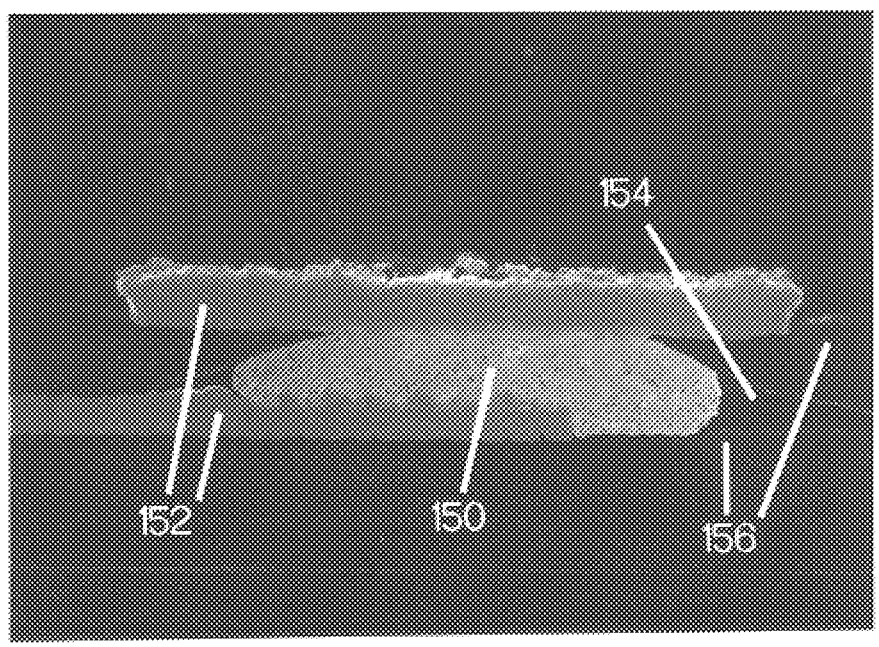
FIG. 5 is a micrograph of a via in two layers of a multi-layered circuit, formed in accordance with the present invention.
Figure 6:
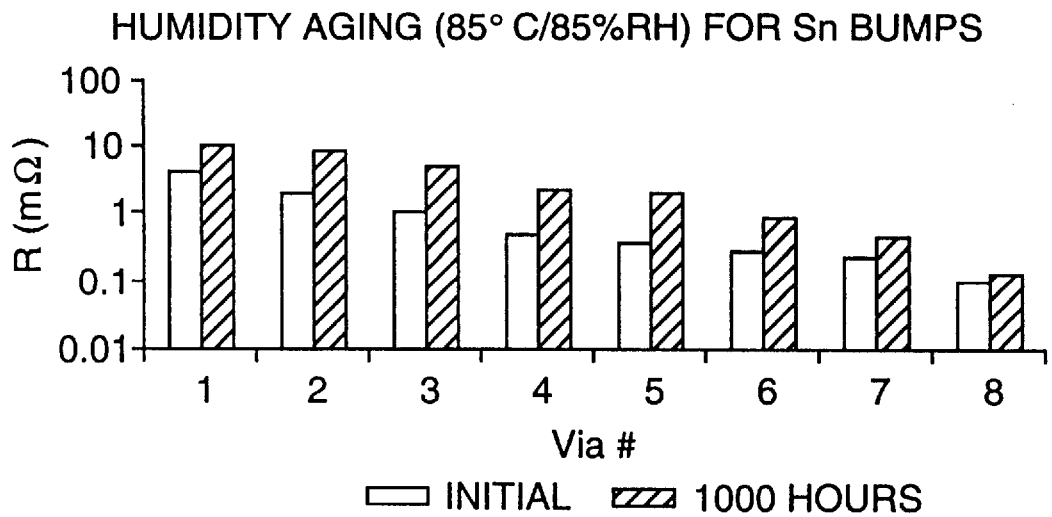
FIG. 6 is a diagram detailing the stability of the resistance of the via connection after 1000 hours in a temperature humidity chamber at 85° C. and 85% relative humidity.
Figure 7:
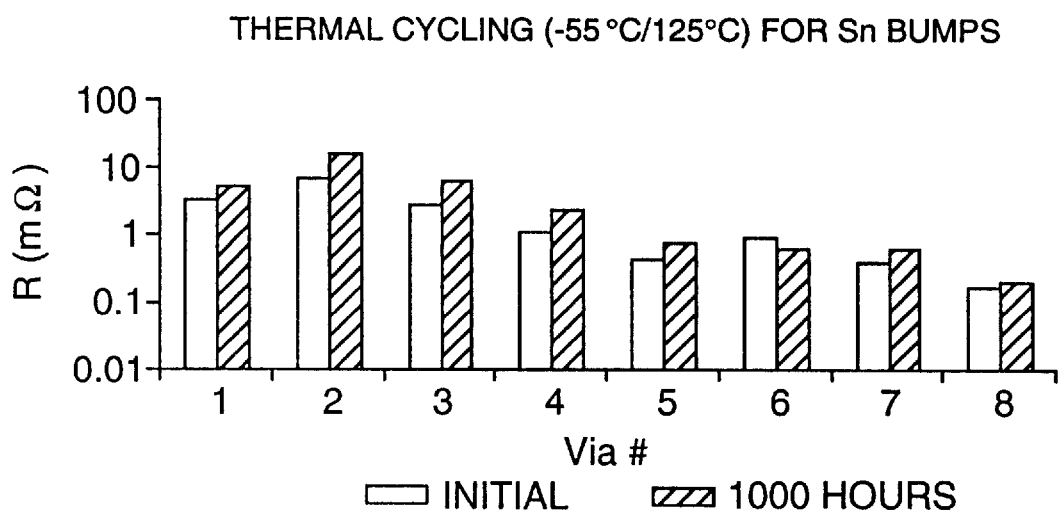
FIG. 7 is a diagram detailing the stability of the via connections after 167 temperature cycles, each cycle being 6 hours long at temperatures from –55° C. to 125° C.

An SEM micrograph of the completed circuit interconnect is shown in FIG. 5. From this micrograph the tin bump 150 connects the two copper circuit traces 152 together, the tin having diffused into the copper circuit traces. The adhesive layer 154 and polyimide film 156 of the circuit layers is also visible in this micrograph The completed circuit interconnect (assembly) was then tested in accelerated testing chambers typical of electronics packaging applications. Examples of the changes in electrical resistance of bump via interconnect after testing in an aging chamber at 85° C. with 85% relative humidity are shown in FIG. 6. Results of a thermal cycling test in a chamber that cycles between −55° C. and 125° C. every six hours are shown in FIG. 7.

The samples of the Circuit interconnects were peeled apart and examined after lamination. This peeling broke open the via connections at the bump/pad interface, formed during lamination copper pad (copper circuit traces, see FIG. 5) included a layer of tin, indicating solid state diffusion at the bump/pad interface.

EXAMPLE 2

A polyimide dielectric film was patterned with copper traces on one side and holes on the other, the pattern traces and holes were made by conventional methods. The holes were located at points where electrical connections were desired. Solder, having a composition of approximately 60% tin and 40% lead, was electrodeposited into the base of the holes using an electroplating solution (Solderon SC solder plating bath, from LeaRonel, Inc.), to form "bumps ". A flux (Kester 2163 from Kester Corp.) was coated on the bump side of the dielectric film by brushing, and the entire circuit layer was placed into a convection oven at 215° C. for 15 seconds to reflow the solder bumps. The flux was removed with water.

A layer of adhesive (Rflex 410, from Rogers Corporation, 100 N. Dobson Road, Chandler, Ariz. 85224) was applied to the bump side by a hot roll laminator at 20 psi ad 150° C. Four layers of the above disclosed dielectric films were stacked on top of each other using a metal plate mounted with pins for registration of the films, and the entire assembly was placed into a platen press. A small amount of pressure, approximately 5 psi, was applied and the press was heated at 15° C./minute to 170° C. and held there for 45minutes. The press was then cooled to room temperature at 5° C./minute. A pressure of 850 psi was applied at 150° C. during the heat-up, and held for the remainder of the cycle. The completed circuit interconnect (assembly) was removed from the press.

Samples made in accordance herewith were electronically tested and all vias produced reliable, low resistance connections. The via connections at the bump/pad interface were mechanically broken (peeled apart, similar to Example 1 above). It was observed that the copper pad included a layer of tin, indicating solid state diffusion at the bump/pad interface.

While embodiments of the present invention have been described so as to enable one skilled in the art to practice the techniques of the present invention, the preceding description is intended to be exemplary. It should not be used to limit the scope of the invention, which should be determined by reference to the following claims.

What is claimed is:

1. A method for interconnecting circuit layers comprising:
    providing a first circuit layer with a first conductor;
    providing a second circuit layer with a second conductor;
    placing a conducting member onto the first circuit layer in electrical communication with said first conductor, said conducting member being of a deformable metal having an outer surface, said conducting member yielding at least upon the application of pressure;
    placing an adhesive layer intermediate said first circuit layer and said second circuit layer;
    aligning said first circuit layer with said second circuit layer;
    applying pressure to said first and second circuit layers, to join the circuit layers;
    said conducting member being of sufficient deformability such that upon said application of pressure joining said circuit layers, said conducting member deforms to expose at least a portion of material from below the outer surface, said material portion in electrical communication with said second conductor.

2. The method of claim 1, wherein said conducting member is of sufficient rigidity that upon said application of pressure, at least a portion of said conducting member pierces said adhesive layer.

3. The method of claim 1, wherein said adhesive layer is placed on said first circuit layer.

4. The method of claim 1, wherein said first circuit layer and said second circuit layer each include at least one dielectric film.

5. The method of claim 4, further comprising forming a via in said at least one dielectric film of the first circuit layer, said via proximate to said first conductor.

6. The method of claim 5, wherein said conducting member is a solder portion and said placing said conducting member onto said first circuit layer includes depositing solder into the via.

7. The method of claim 6, further comprising forming the solder in the via until at least a portion of the conducting member is above the plane formed by the dielectric film of the first circuit layer.

8. The method of claim 1, further comprising applying heat to said first and second circuit layers.

9. The method of claim 8, further comprising heating said first and second circuit layers to slightly less than the melting temperature of the conducting member.

10. The method of claim 2, wherein said adhesive flows at a stress less than the yield strength of the conducting member.

11. The method of claim 1, wherein conducting member includes tin or tin-lead solder.

12. The method of claim 1, wherein the first conductor and the second conductor include copper.

13. The method of claim 8, further comprising heating the first and second layers to permit solid state diffusion of the conducting member and the respective first and second conductors.

14. The method of claim 1, additionally comprising:
    heating the joined circuit layers to a temperature greater than the melting temperature of the material of the conducting member for a predetermined period for enhancing metallurgical bond formation and for relieving stresses in the resultant structure.

15. A method for interconnecting circuit layers comprising:
    providing at least a first circuit layer with a plurality of first conductors and a second circuit layer with a plurality of second conductors;
    placing at least a first conducting member and a second conducting member onto the first circuit layer in electrical communication with at least one of said first conductors, said at least a first and at least a second conducting members being of different heights and each being of a deformable metal having an outer surface, said conducting members yielding at least upon the application of pressure;

placing all adhesive layer intermediate said first circuit layer and said second circuit layer;

aligning said first circuit layer with said second circuit layer; and applying pressure to at least one of said first or second circuit layers, to join said circuit layers;

said conducting members being of sufficient deformability such that upon said application of pressure to join said circuit layers, said conducting members deform to expose at least a portion of material from below the outer surface, each of said material portions in electrical communication with at least one of said second conductors.

* * * * *

UNITED STATES PATENT AND TRADEMARK OFFICE
CERTIFICATE OF CORRECTION

PATENT NO. : 5,873,161
DATED : February 23, 1999
INVENTOR(S) : Yu Chen, Joel A. Gerber, and Joshua W. Smith It is certified that error appears in the above-indentified patent and that said Letters Patent is hereby corrected as shown below:

Col. 12, line 44, "wherein conducting" should read --wherein the conducting--.

Col. 13, line 6, "placing all adhesive" should read --placing an adhesive--.

Signed and Sealed this

Second Day of November, 1999

Attest:

Q. TODD DICKINSON

*Attesting Officer*     Acting Commissioner of Patents and Trademarks